United States Patent
Hurrell

(10) Patent No.: US 11,689,166 B2
(45) Date of Patent: Jun. 27, 2023

(54) CIRCUITRY FOR REDUCING DISTORTION OVER A WIDE FREQUENCY RANGE

(71) Applicant: Analog Devices International Unlimited Company, Limerick (IE)

(72) Inventor: Christopher Peter Hurrell, Cookham (GB)

(73) Assignee: Analog Devices International Unlimited Company, Limerick (IE)

( * ) Notice: Subject to any disclaimer, the term of this patent is extended or adjusted under 35 U.S.C. 154(b) by 118 days.

(21) Appl. No.: 17/167,838

(22) Filed: Feb. 4, 2021

(65) Prior Publication Data
US 2022/0247369 A1     Aug. 4, 2022

(51) Int. Cl.
H03F 1/32     (2006.01)
H03F 3/24     (2006.01)
H03F 1/56     (2006.01)
H03F 3/195    (2006.01)

(52) U.S. Cl.
CPC ............. H03F 3/245 (2013.01); H03F 1/565 (2013.01); H03F 3/195 (2013.01); H03F 2200/222 (2013.01)

(58) Field of Classification Search
CPC ........................................................ H03F 1/32
USPC .................................................. 330/149, 151
See application file for complete search history.

(56) References Cited

U.S. PATENT DOCUMENTS

| | | | |
|---|---|---|---|
| 3,873,936 A * | 3/1975 | Cho | H03F 1/3229 330/149 |
| 3,970,953 A | 7/1976 | Walker et al. | |
| 5,903,189 A | 5/1999 | Huijser | |
| 6,326,840 B1 | 12/2001 | Funada et al. | |
| 6,326,845 B1 * | 12/2001 | Miyaji | H03F 1/3229 330/149 |
| 6,476,674 B2 | 11/2002 | Smedegaard-pedersen et al. | |

(Continued)

FOREIGN PATENT DOCUMENTS

| CN | 106059508 A | 10/2016 |
|---|---|---|
| EP | 1936804 B1 | 11/2011 |

(Continued)

*Primary Examiner* — Henry Choe
(74) *Attorney, Agent, or Firm* — Schwegman Lundberg & Woessner, P.A.

(57) ABSTRACT

A combination amplifier can include a "main amplifier circuit" for signal amplification, and a matching "compensation amplifier circuit" to monitor distortion in the main amplifier output signal. The compensation amplifier circuit provides a compensation signal to the main amplifier circuit to compensate for and servo out distortion therein. The compensation amplifier circuit includes a passive input network and an amplifier. The passive input network can connect to both the input and output nodes of the main amplifier circuit such that the input and output signals cancel within the passive input network, leaving only the low level distortion component introduced in the main amplifier. Thus, the compensation amplifier is then only operating on the low-level distortion introduced in the main amplifier to generate the compensation signal. Because the compensation amplifier is then only operating on the very low distortion signal, any distortion it introduces into the compensation signal is negligible.

21 Claims, 11 Drawing Sheets

(56) References Cited

U.S. PATENT DOCUMENTS

| | | | |
|---|---|---|---|
| 6,501,332 B1 * | 12/2002 | Yan | H03F 3/68 330/252 |
| 6,714,072 B2 | 3/2004 | Kenington | |
| 6,897,721 B2 | 5/2005 | Hellberg | |
| 6,940,349 B2 | 9/2005 | Hellberg | |
| 7,068,099 B2 | 6/2006 | Versteegen | |
| 7,315,207 B2 | 1/2008 | Shiikuma | |
| 7,680,467 B2 | 3/2010 | Ishigami | |
| 8,558,616 B2 | 10/2013 | Honda et al. | |
| 8,604,879 B2 | 12/2013 | Mourant et al. | |
| 8,903,336 B2 | 12/2014 | Fonden et al. | |
| 9,071,201 B2 | 6/2015 | Jones et al. | |
| 9,178,473 B2 | 11/2015 | Sankaranarayanan | |
| 9,231,626 B2 | 1/2016 | Okazaki et al. | |
| 9,813,029 B2 | 11/2017 | Zhu et al. | |
| 2003/0227324 A1 * | 12/2003 | Rydin | H03F 1/3282 330/149 |

FOREIGN PATENT DOCUMENTS

| | | | |
|---|---|---|---|
| JP | 2004320652 A | | 11/2004 |
| JP | 2004349950 A | | 12/2004 |
| WO | WO-2017144106 A1 | | 8/2017 |

* cited by examiner

CIRCUITRY FOR REDUCING DISTORTION OVER A WIDE FREQUENCY RANGE

TECHNICAL FIELD

The present disclosure relates to electrical circuitry arrangements such as amplifiers and filters that have reduced distortion over a wideband frequency range of operation, due to the inclusion of a mirror compensation circuit that monitors distortion in a primary working circuit and injects distortion compensation signals into the primary working circuit to reduce the overall distortion.

BACKGROUND

Reducing distortion in electrical circuits is desirable, to provide lower noise signals that can then be deployed in various applications. U.S. Pat. No. 6,501,332 describes a method of reducing distortion in an amplifier, utilizing a correction loop amplifier in conjunction with a main amplifier to produce signal amplification with low total harmonic distortion. The correction amplifier has one input directly coupled to a first input of the main amplifier, and an output coupled to a second input of the main amplifier via a resistor. The second input of the correction amplifier is coupled to a signal input via a voltage divider or RC network, the signal input to the voltage divider or RC network being the output signal of the main amplifier. The correction amplifier therefore operates on both the input signal and the output signal including any distortion, which requires significant power and hence further means the correction amplifier itself may be introducing further distortion. Other techniques for reducing distortion in electrical circuitry are therefore desirable.

SUMMARY

The present disclosure relates to a combination amplifier where a "main amplifier circuit" is provided (which may be inverting, non-inverting or differential) to perform the main task of signal amplification, and a matching "compensation amplifier circuit" is further provided to monitor error in the main amplifier output signal. The compensation amplifier circuit provides a compensation signal to a node of the main amplifier circuit to compensate for the error in the main amplifier circuit and to effectively servo out the error at the main amplifier circuit output. The compensation amplifier circuit includes a passive network and an amplifier, with the compensation amplifier circuit being connected to both the input and output nodes of the main amplifier circuit and is so arranged such that the input and output signals cancel within the passive input network, leaving only the low level error component introduced in the main amplifier. Because of this cancellation the compensation amplifier is then only operating on the low level error component introduced in the main amplifier in order to generate the compensation signal. Moreover, because the compensation amplifier is then only operating on the very low error signal, any error it introduces itself into the compensation signal is extremely low, effectively negligible. The effect of the combination amplifier arrangement as described above is that total harmonic error is reduced by as much as 50 db. As well as providing low error amplifiers, the disclosure can also be used to provide low error filters and oscillators.

In view of the above, from one aspect the present disclosure provides a composite amplifier comprising a main amplifier circuit, having a main component network and a main amplifier, the amplifier having a first input channel on which a first input signal is input to a first input node of the main amplifier and a first output channel from which a first output signal is output from the main amplifier on a corresponding first output node, the main amplifier circuit responding to the first input signal to produce an output signal including an error component introduced by offsets or nonlinearities in the main amplifier circuit; a compensation amplifier circuit connected to the first input channel and first output channel of the main amplifier circuit to receive the first input signal and the first output signal, and having a compensation component network and a compensation amplifier, the arrangement being such that the compensation amplifier circuit combines the first input signal and the first output signal to cancel the first input and first output signals, leaving the error in the first output signal introduced by the main amplifier circuit as an input to the compensation amplifier, the compensation amplifier circuit thereby being arranged to sense the error on the first output channel of the main amplifier circuit, and generate a first error compensation signal in dependence thereon, the arrangement being such that the first error compensation signal is then applied to the main amplifier circuit, wherein the error compensation signal lowers the error in the output signal.

In one embodiment, the first input node of the main amplifier is an inverting input node, the input to the compensation amplifier being applied to a non-inverting input node of the compensation amplifier, and the first error compensation signal is applied to the first input channel of the main amplifier circuit.

In a further embodiment, the first input node of the main amplifier is an inverting input, the input to the compensation amplifier is applied to an inverting input node of the compensation amplifier, and the first error compensation signal is applied back to a second input node of the main amplifier, wherein the second input node of the main amplifier is a non-inverting input.

In another embodiment, the composite amplifier further comprises a second main amplifier circuit, having a second main component network and a second main amplifier, the second main amplifier having a second input channel on which a second input signal is input to a first input node of the second main amplifier and a second output channel from which a second output signal is output from the second main amplifier on a corresponding first output node of the second main amplifier, the second main amplifier circuit responding to the second input signal to produce a second output signal including an error component introduced by offsets or nonlinearities in the second main amplifier circuit; a second compensation amplifier circuit connected to the second input channel and second output channel of the second main amplifier circuit to receive the second input signal and the second output signal, and having a second compensation component network and a second compensation amplifier, the arrangement being such that the second compensation amplifier circuit combines the second input signal and the second output signal to cancel the second input and second output signals, leaving the error in the second output signal introduced by the second main amplifier circuit as a first input to a first input node of the second compensation amplifier, the second compensation amplifier circuit thereby being further arranged to sense the error on the second output channel of the second main amplifier circuit, and generate a second error compensation signal in dependence thereon, the arrangement being such that the second error compensation signal is then applied to the second main amplifier circuit, wherein the second error compensation signal lowers the error in the second output signal; and connections arranged so as to cause the composite amplifier to operate as an oscillator, the connections comprising the first output channel of the main amplifier circuit being coupled to the second input channel of the second main amplifier circuit, wherein the first output signal is the second input signal, and the second output channel of the second main amplifier circuit being coupled to the first input channel of the main amplifier circuit, wherein the second output signal is the first input signal.

Moreover, in another embodiment, wherein the main amplifier circuit is configured such that the main amplifier circuit provides a gain of −1 at a chosen frequency of oscillation.

In another example the main component network further comprises reactive components.

In an embodiment, the compensation component network includes identical components to those in the main component network, and the second compensation component network includes identical components to those in the second main component network.

In a further embodiment, the second compensation component network comprises: a gain control transistor, wherein the gain control transistor introduces a non-linear voltage error; and a second transistor, arranged so as to compensate for the non-linear voltage error introduced by the gain control transistor.

In a further embodiment, the gain control transistor is coupled between the second input channel and the first node of the second compensation amplifier; and the second transistor is coupled between the second output channel and the first node of the second compensation amplifier.

In a further embodiment, the gain control transistor is controlled by an Automatic Gain Control circuit.

In a further embodiment, a control terminal of the gain control transistor and a control terminal of the second transistor are set to a substantially similar voltage such that a voltage dropped across the gain control transistor is substantially similar to a voltage dropped across the second transistor, thereby causing cancellation of the non-linear voltage error.

In a further embodiment, the composite amplifier is a differential amplifier, further having a second input channel on which a second input signal is input to a second input node of the main amplifier and a second output channel from which a second output signal is output from the main amplifier on a corresponding second output node, the main amplifier circuit responding to the second input signal to produce a second output signal including an error component introduced by offsets or nonlinearities in the main amplifier circuit; the compensation amplifier circuit being further connected to the second input channel and the second output channel of the main amplifier circuit to receive the second input signal and the second output signal, and having a compensation component network and a compensation amplifier, the arrangement being such that the compensation amplifier circuit combines the second input signal and the second output signal to cancel the second input and second output signals, leaving the error in the second output signal introduced by the main amplifier circuit as an input to a second input of the compensation amplifier, the compensation amplifier circuit thereby being arranged to sense the error on the second output channel of the main amplifier circuit in addition to the first output channel, and generate a second error compensation signal in dependence on the error on the second output channel, the arrangement being such that the second error compensation signal is then applied to the second input channel of the main amplifier circuit and the first error compensation signal is then injected back onto the first input channel of the main amplifier circuit, wherein the error compensation signals lower the error in the respective first and second output signals.

In a further embodiment, the compensation component network further comprises respective reactive component networks.

In a further embodiment, the differential amplifier comprises connections to cause the composite amplifier to operate as a differential oscillator.

In a further embodiment, the connections comprise the first output channel being coupled to the second input channel of the main amplifier wherein the first output signal is fed back as the second input signal, and the second output channel being coupled to the first input channel of the main amplifier wherein the second output signal is fed back as the first input signal.

In a further embodiment, the compensation component network further comprises: a first gain control transistor, wherein the first gain control transistor introduces a first non-linear voltage error; a second gain control transistor, wherein the second gain control transistor introduces a second non-linear voltage error; a third transistor, arranged so as to compensate for the non-linear voltage error introduced by the first gain control transistor; and a fourth transistor, arranged so as to compensate for the non-linear voltage error introduced by the second gain control transistor.

In a further embodiment, the first gain control transistor is coupled between the first input channel and the compensation amplifier; the second gain control transistor is coupled between the second input channel and the compensation amplifier; the third transistor is coupled between the first output channel and the compensation amplifier; and the fourth transistor is coupled between the second output channel and the compensation amplifier.

In a further embodiment, the compensation component circuit further comprises: a first additional impedance network, arranged such that, at a frequency of oscillation of the oscillator, an impedance coupled between the first input channel and the first gain control transistor is the same as an impedance coupled between the first output channel and the third transistor; and a second additional impedance network, arranged such that, at the chosen frequency of oscillation, an impedance coupled between the second input channel and the second gain control transistor is the same as an impedance coupled between the second output channel and the fourth transistor.

In a further embodiment, a composite amplifier comprises: a main amplifier circuit, having a main component network and a main amplifier, wherein the main amplifier comprises: a first input channel on which a first input signal is input to a non-inverting input node of the main amplifier; an inverting input node; a first output channel from which a first output signal is output from the main amplifier on a corresponding first output node, the main amplifier introducing an error component, introduced by offsets or non-linearities in the main amplifier circuit, into the first output signal; a compensation amplifier circuit, connected to the first input channel and the first output channel, having a compensation component network and a compensation amplifier, wherein the compensation amplifier comprises: a non-inverting input node, wherein the non-inverting input node is connected to the first output channel via the compensation component network; an inverting input node, wherein the inverting input node is connected to the first input channel; wherein the compensation amplifier circuit is arranged to sense the error of the first output channel of the main amplifier circuit, and generate a first error compensation signal in dependence thereon, the arrangement being such that the first error compensation signal is applied to the inverting input node of the main amplifier; and wherein the error compensation signal lowers the error in the output signal.

BRIEF DESCRIPTION OF THE DRAWINGS

Embodiments of the disclosure will now be further described by way of example only and with reference to the accompanying drawings, wherein like reference numerals refer to like parts, and wherein.

DESCRIPTION OF THE EMBODIMENTS

Overview

Figure 1:
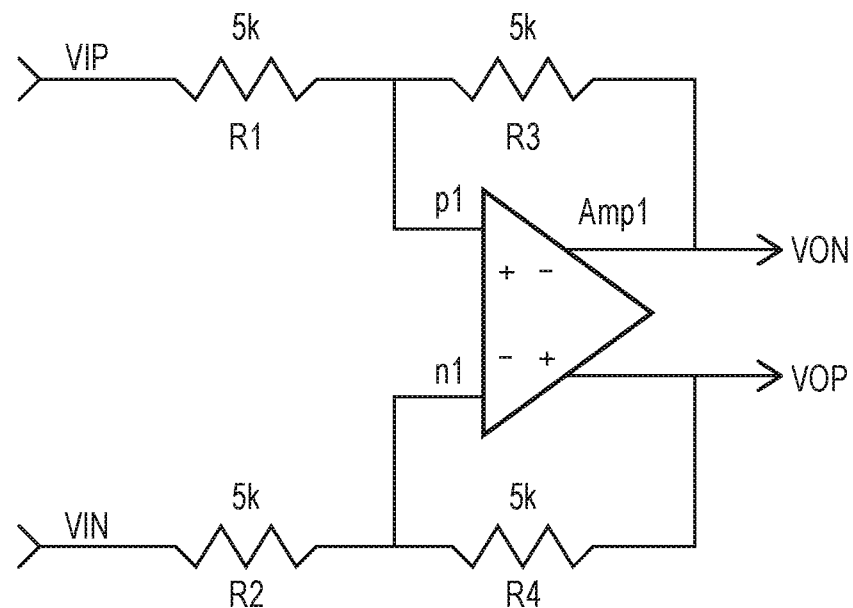
FIG. 1 is a circuit diagram of an inverting amplifier.

Harmonic distortion in electronic circuits such as amplifiers, filters and oscillators generally increases with frequency of operation, thus impeding higher frequency performance and reducing the performance of electronic systems in which such circuits might be used. FIG. 1 shows an example inverting amplifier circuit having two input nodes VIP and VIN and providing two output nodes VON and VOP. Respective passive feedback and input networks formed by resistors R1 and R3, and R2 and R4, are provided, with R1 and R3 connected in series between VON and VIP, and R2 and R4 connected in series between VOP and VIN. An input p1 is taken from the node between R1 and R3 and input to the non-inverting input of an amplifier Amp1, and an input n1 is taken from the node between R2 and R4 and input to the inverting input of Amp1, with VON being taken from the inverting output of Amp1, and VOP from the non-inverting output of Amp1. With such an amplifier arrangement there are typically three major causes of distortion, being:

1. The non-linearity of the differential input pair;
2. The non-linearity of the output stage; and
3. Non linear bias (base) currents feeding into R3 and R4.

At high input frequencies, the three modes of distortion become further exacerbated. In particular, re (1) above, at high input frequencies the current delivered to the Miller capacitance of the amplifier increases proportionally, with the result that the amplifier input voltage increases and the differential pair of transistors in the amplifier become increasingly non-linear in operation. In addition, re (2) above, the non-linearity of the output stage referred to the amplifier input increases by 1/Gain (where Gain $\alpha$ 1/input frequency), and hence is further frequency dependent, increasing at higher frequencies. Finally, re (3), as the amplifier input voltage increases (e.g. due to (1) and (2) above) then non-linear bias currents also increase.

For (1) & (2), the output distortion typically equals the amplifier input distortion multiplied by the 'noise gain' of the amplifier i.e. $(1+R_{FB}/R_{IN})$. For (3), however, the output distortion equals the amplifier input bias current distortion multiplied by $2*R_{FB}$. Because of this relationship of (3) there is no direct relationship between the amplifier input voltage and the amplifier output voltage, and non-linear distortion is introduced into the output signal, Detecting and then compensating for this non-linear distortion without introducing further distortion due to the compensation circuitry is therefore the challenge.

In order to address this issue, in the present disclosure we describe how a passive electrical component network can be provided to allow a comparison between the output and input of the amplifier circuit thereto to provide an almost perfect measure of distortion at the amplifier output from all three mechanisms (1), (2), and (3). This measured distortion, which is typically very low, can then be provided to a second, compensation amplifier, which generates a distortion compensation signal which can then be fed back into the main amplifier circuit to eliminate distortion from the output thereof. Moreover, because the compensation amplifier is itself only operating on the typically very small distortion signal per se that was isolated by the passive network, then the compensation amplifier operates in its highly linear region of operation, and essentially introduces no further distortion into the compensation signal.

Figure 2:
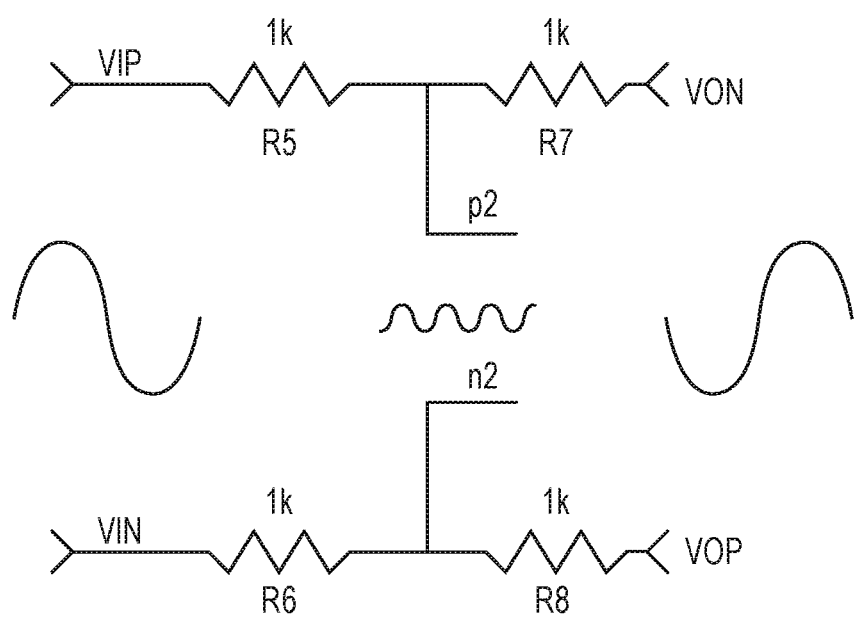
FIG. 2 is a circuit diagram of a passive compensation component network.
Figure 3:
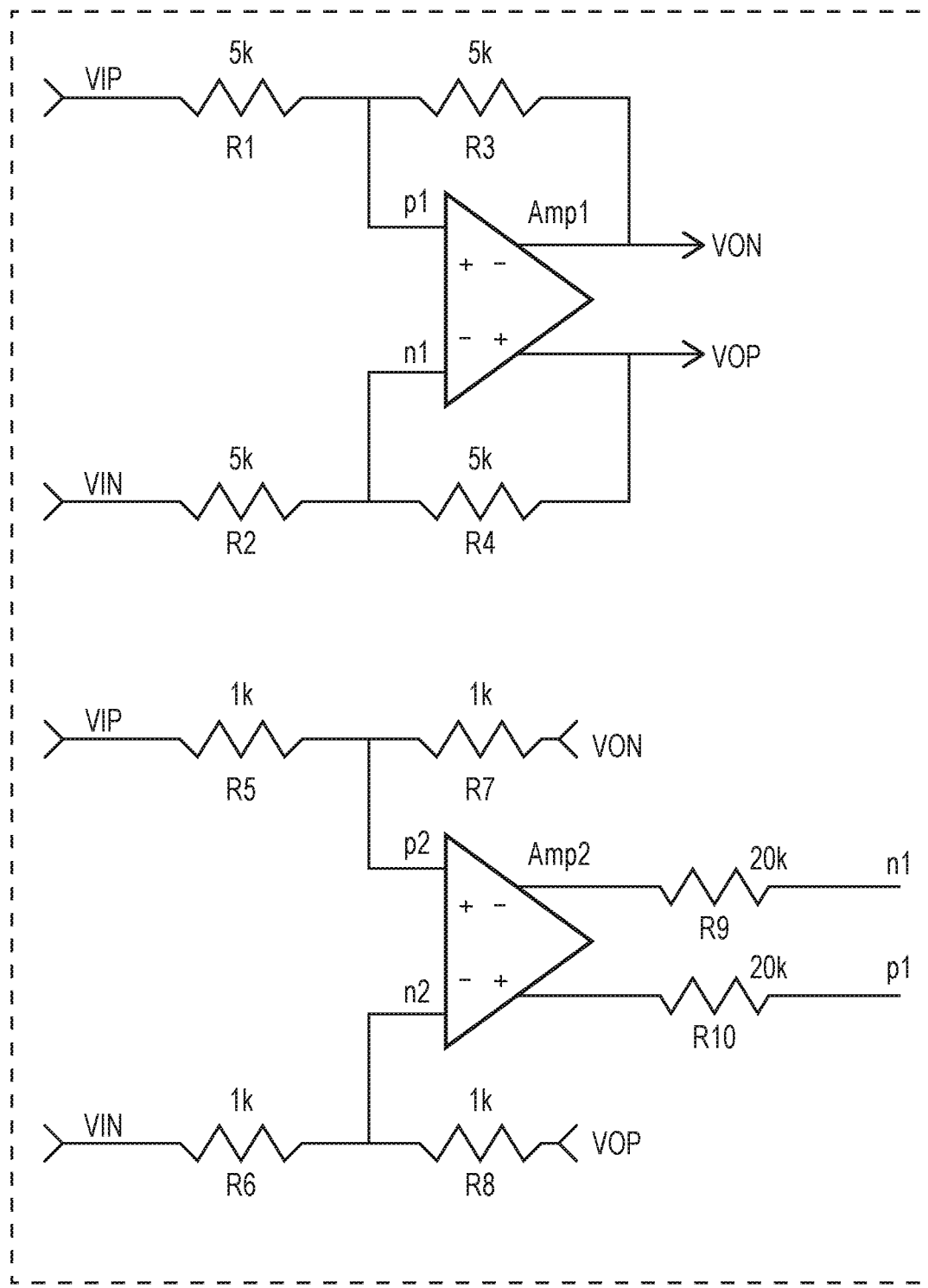
FIG. 3 is a circuit diagram of a composite amplifier according to a first example of the disclosure.

FIGS. 2 and 3 illustrate the concept in further detail. FIG. 2 shows a passive electrical component network to compare VIP with VON and VIN with VOP. Specifically, an electrical divider formed by series resistors R5 and R7 is connected between VIP and VON, with a first output p2 being taken from the node between the resistors. Similarly, a second electrical divider is formed between VIN and VOP by resistors R6 and R8 in series, with a second output n2 being taken from the node between R6 and R8. The voltage between p2 and n2 V(p2,n2) is a perfect measure of distortion at the amplifier output for all 3 mechanisms (1), (2), and (3).

Having obtained the distortion measure V(p2, n2) using the passive electrical component network of FIG. 2, as shown in FIG. 3 a compensation signal can then be generated by inputting V(p2, n2) generated by the passive electrical network into a suitable compensation amplifier Amp2, to generate respective inverting and non-inverting compensation signals that are then injected back into the main amplifier Amp1 inputs n1 and p1 via respected resistors R9 and R10, The result is a composite circuit having a main amplifier Amp1, that receives and amplifies the input signals that need to be amplified, and a compensating amplifier Amp2, that receives via the passive electrical network only the distortion generated by the main amplifier, and then generates a distortion compensation signal to be injected back into the main amplifier based only on the distortion. As such, because the distortion signal is typically very low, then as noted above the compensation amplifier will be operating in a highly linear region of operation the distortion compensation signal will itself be very clean, and hence should almost completely effectively control the main amplifier to remove almost all distortion from its output signal.

Figure 4:
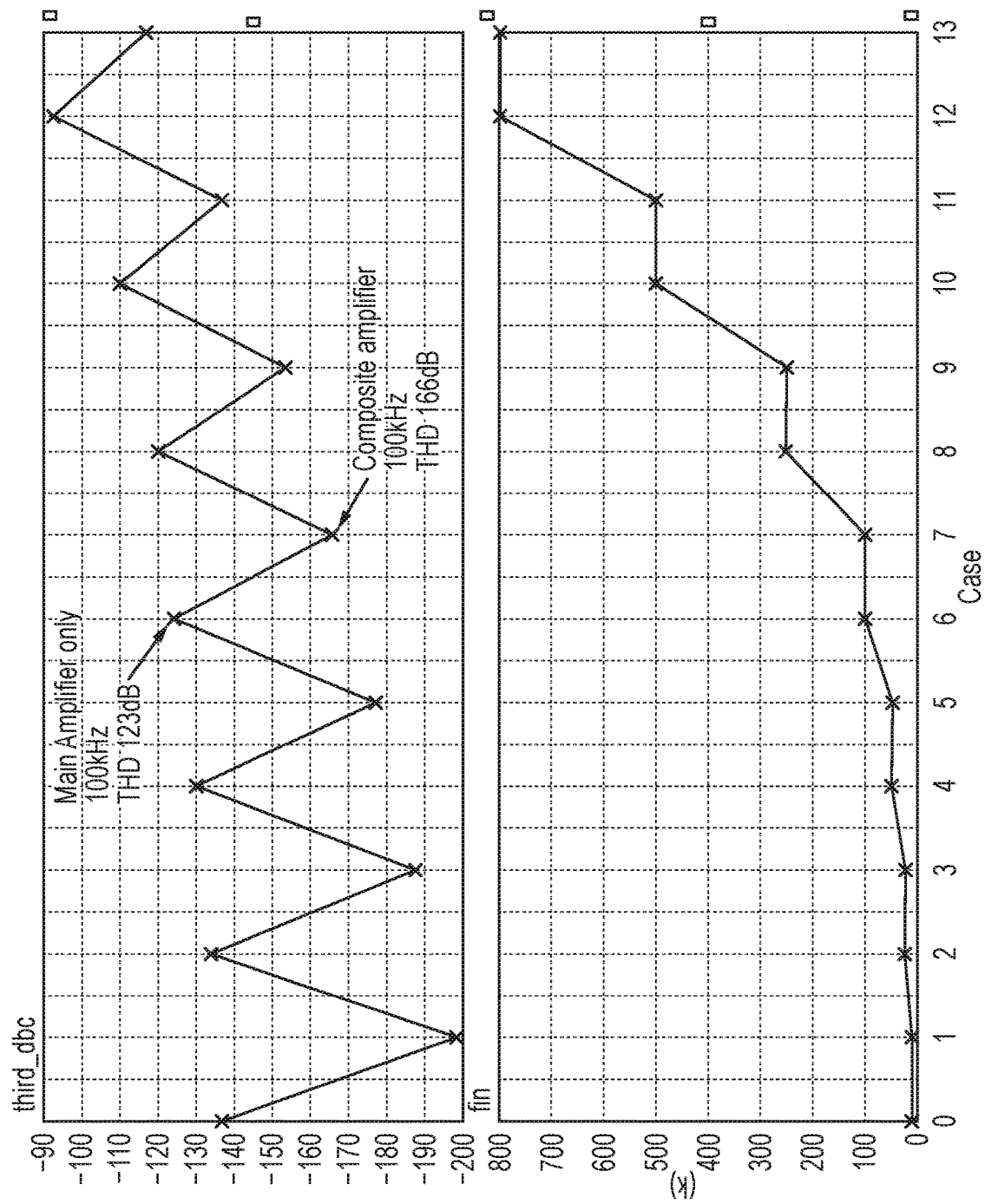
FIG. 4 is a plot of simulation results illustrating total harmonic distortion across different frequencies of the arrangements of both FIG. 1 and FIG. 3.

FIG. 4 shows numerically the effect of the above operation, obtained via circuit simulation. The lower plot shows frequency of operation (on the y-axis) for 14 different simulations. The even numbered simulations were of the operation of the main amplifier only; the odd numbered simulations were of the composite arrangement including the main amplifier, and the compensation amplifier. The top plot shows that for each simulation across the entire simulated frequency range the total harmonic distortion (THD) in the composite arrangement was significantly lower than where the compensation amplifier Amp2 is not used. For example, at 100 kHz operating frequency, the main amplifier by itself (i.e. the FIG. 1 arrangements) simulated a THD of −123 dB, whereas the composite arrangement of FIG. 3 including the compensation amplifier gave a simulated THD of −166 dB, an improvement of −43 dB (i.e. there was approximately 20000 times more distortion in the main amplifier when used by itself than in the composite amplifier arrangement).

The concepts of the above i.e. using a compensation component network that is usually formed of passive components to isolate the distortion from the output signal of a main amplifier, and then to apply the isolated distortion signal to a compensation amplifier to generate a distortion compensation signal that is then injected back into the input of the main amplifier can be applied in many different electrical circuit types to provide many difference examples of the present disclosure. For example, as will be described below, the concept may be made to apply in single ended inverting and non-inverting amplifiers, in differential amplifiers, in single ended oscillators, in differential oscillators, and in both single ended and differential filter circuits, such as a differential band-pass filter. There thus follows a brief description of the application of the above described concepts to several different circuit applications.

The distortion introduced may be referred to as an error component, which may be caused by either offsets or nonlinearities in the main amplifier circuit.

EXAMPLE 1

Inverting Amplifier

Figure 5:
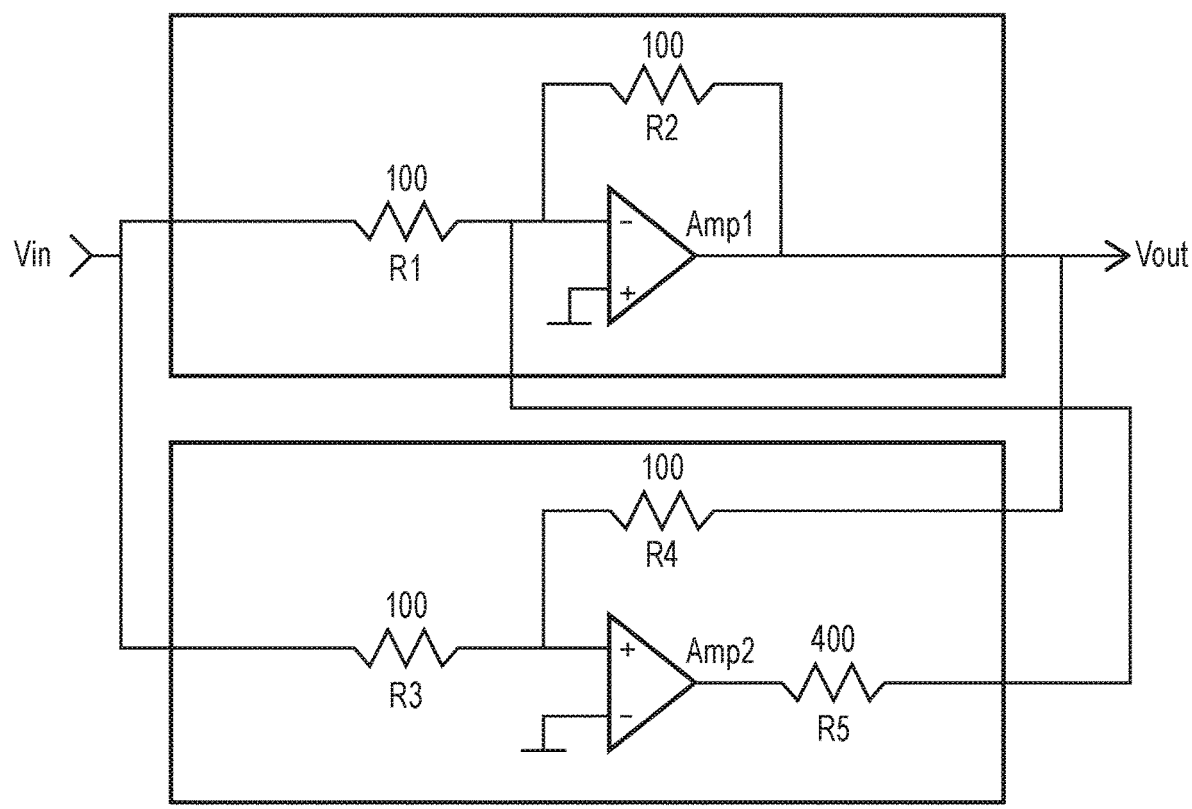
FIG. 5 shows an inverting composite amplifier according to another example of the disclosure.

FIG. 5 shows an inverting amplifier circuit that uses the concept of the main amplifier Amp 1 and the compensation amplifier Amp 2 to provide an inverting amplifier circuit with much lower THD.

The main amplifier (in the upper box), when operating on its own, introduces distortion in two ways. Firstly, the main amplifier will have finite and non-linear gain. This finite non-linear gain will result in a non-linear signal at the input of the main amplifier which is transferred to the output of the main amplifier by the noise gain of the amplifier (1+R2/R1), Secondly the main amplifier will have non-linear current flowing from its inputs. The current flowing from the −ve input flows into R2 causing a non-linear voltage across R2 and hence at the amplifier's output.

Now let's consider the compensation circuit in the lower box. The output node has a signal equal to −Vin +Vdistortion. Assuming the compensation amplifier amp2 is an ideal amplifier then the +ve input of amp2 will be at a potential of Vdistortion/2 (−Vin and +Vin effectively cancel). Amp2 has high gain and will respond to the voltage Vdistortion/2 at its input and produces a voltage at its output causing a current to flow through R5 and R2 which will adjust the output voltage on Vout, causing the voltage at the input of Amp2 to change. The sign of this change will be such as to servo Amp2 input voltage to a value very close to zero.

If the positive input of the compensation amplifier is servoed to exactly zero Volts and we assume that the non-linear currents flowing from the inputs of the actual compensation amplifier are also zero (or at least negligible) then Vout will be exactly −Vin (since all the current that flows through R3 flows through R4 and R3=R4). The assumption that the non-linear input currents of the compensation Amplifier are negligible turns out to be a very good one. This is because the compensation amplifier is providing only a very small correction signal to the main amplifier circuit and hence the input stage of the compensation amplifier operates in a highly linear region.

EXAMPLE 2

Inverting Amplifier (Alternative)

Figure 6:
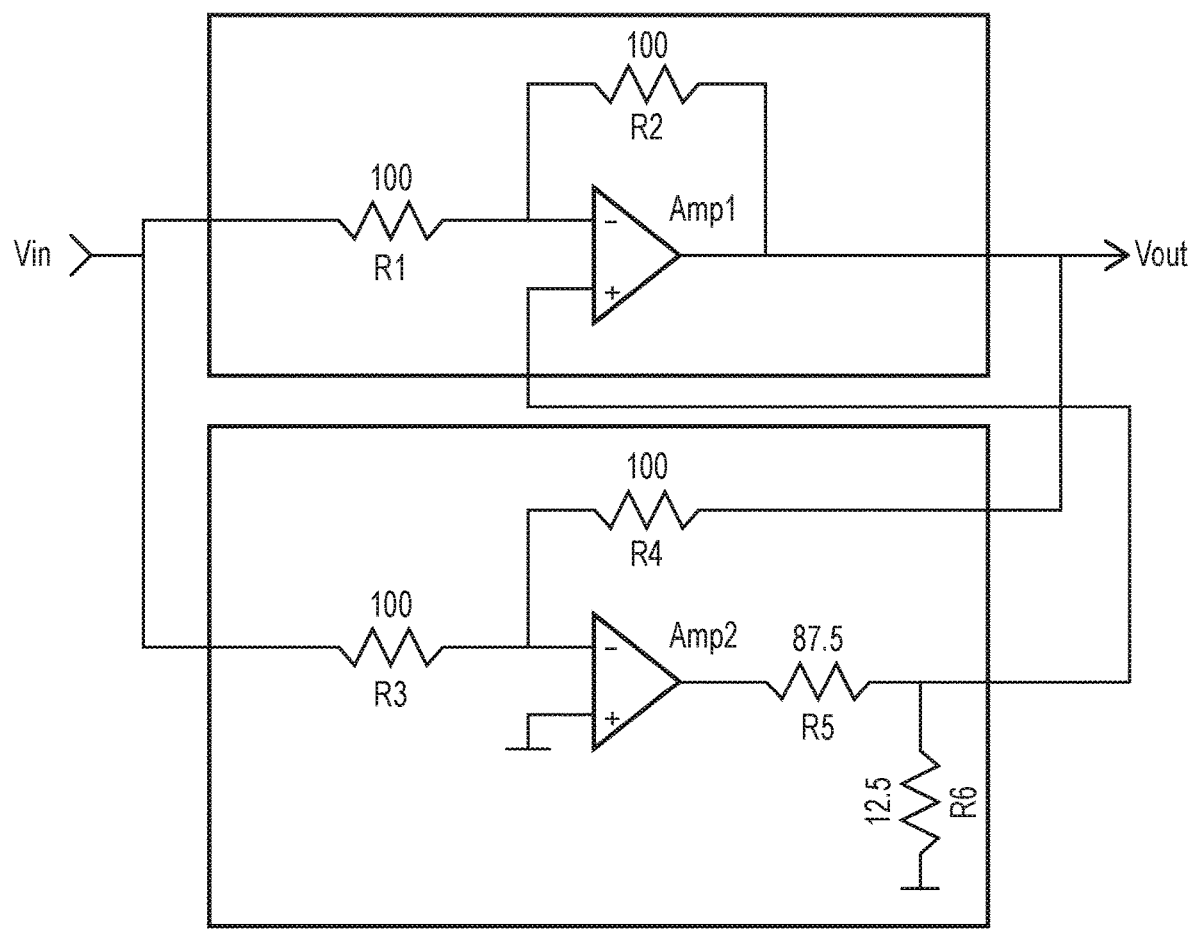
FIG. 6 shows an alternative inverting composite amplifier according to another example of the disclosure.

FIG. 6 is an alternative inverting amplifier arrangement. In this arrangement the output of Amp2 is first attenuated by R5 and R6 before being applied to the positive input of Amp1 (rather than the negative input as in Example 1). As the correction signal is being applied to the opposite terminal of Amp2, Amp1 inputs need to be swapped so that the correction provided by Amp2 has the correct sign. So now the +ve input of Amp2 is connected to ground and the −ve input is connected to the node between R3 and R4. The provision of the divider circuit, formed by R5 and R6, maintains the same gain between the output of amp2 and the output of Amp1 in example 1. It should be noted that making this gain too high can lead to instability.

EXAMPLE 3

Non-Inverting Amplifier

Figure 7:
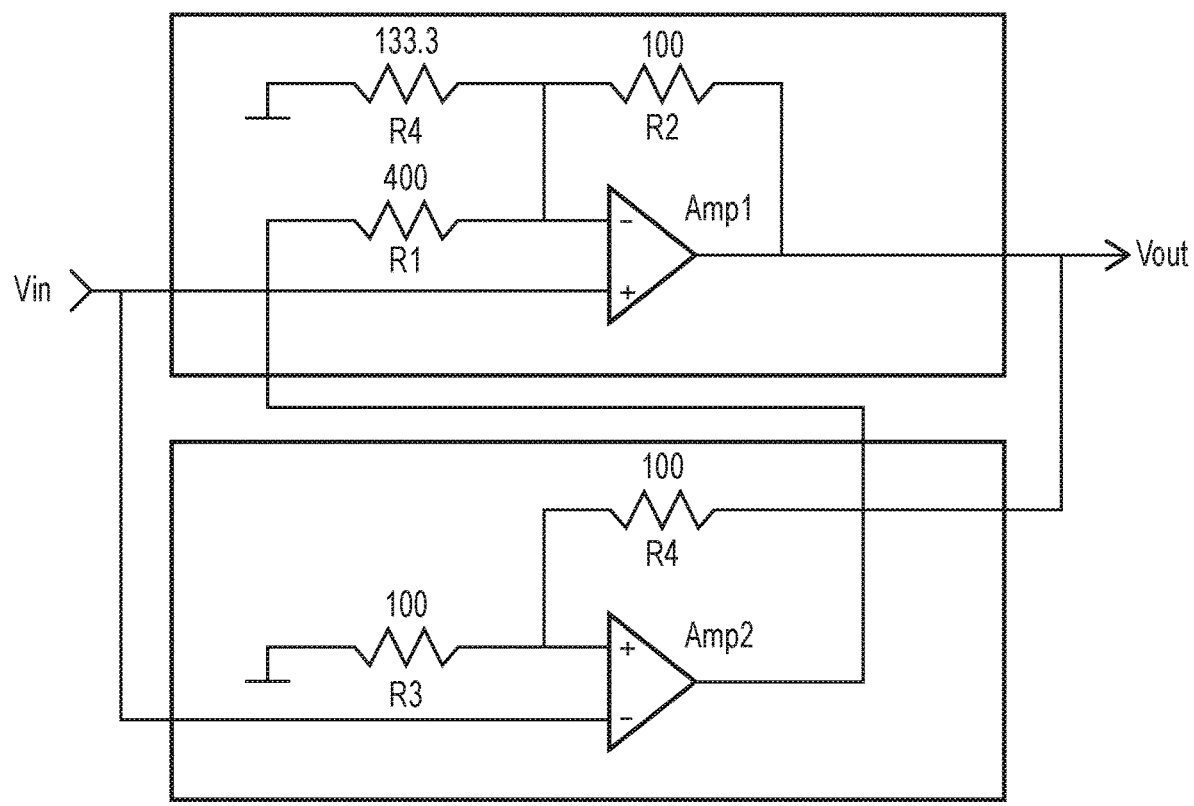
FIG. 7 shows a non-inverting composite amplifier according to another example of the disclosure.

FIG. 7 shows a non-inverting amplifier arrangement. Here, the main amplifier circuit is shown in the upper box around Amp1. The compensation circuit is in the lower box, arranged around Amp2. It will be seen that a passive network comprising the divider formed by resistors R3 and R4 is provided to feed the output of the worker amplifier Amp1 to the manager amplifier Amp2. Again, the divider formed by R3 and R4 acts to isolate the distortion in the output of the main amplifier Amp1 so that the compensation amplifier is acting on the distortion only to generate a compensation signal, which is then fed into the worker amplifier inverting input via resistor R1.

Thus, while the configuration of the non-inverting mode of FIG. 7 is different to the inverting-mode of FIGS. 5 and 6, the circuit is again arranged so that the compensation amplifier is only processing the small distortion signal.

EXAMPLE 4

Differential Amplifier

Figure 8:
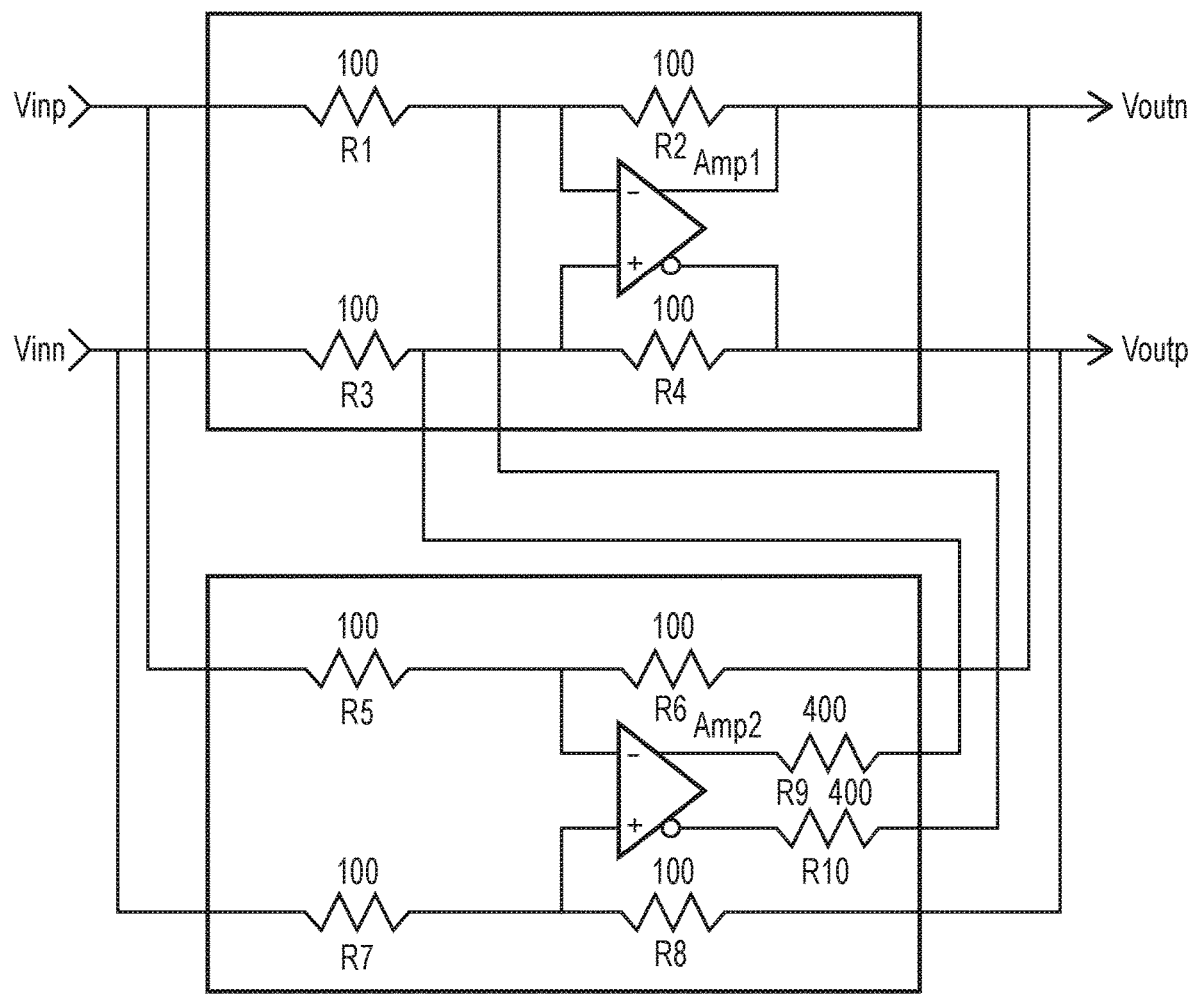
FIG. 8 shows a differential composite amplifier according to another example of the disclosure.

FIG. 8 shows a differential amplifier arrangement that makes use of the concepts of the present disclosure. The upper box contains a differential main amplifier circuit arranged around Amp1, and the lower box contains a matching compensation amplifier circuit arranged around Amp2. It will be seen that a first passive electrical network formed by resistors R5 and R6 feeds the inverting input and output signals from the main amplifier to the inverting input of the compensation amplifier, whereas a second passive electrical network formed by resistors R7 and R8 feeds the non-inverting input and output signals from the main output to the non-inverting input of the compensation amplifier. The inverting and non-inverting outputs of the compensation amplifier are then fed into the inverting and non-inverting inputs of the main amplifier respectively, via scaling resistors R9 and R10 respectively.

As with the previous examples, therefore, the passive electrical networks of R5 and R6 and R7 and R8 isolate the distortion signal from the output of the main amplifier, so that the compensation amplifier operates on the distortion signal only, with the resulting n and p channel distortion compensation signals then being injected into each respective channel input of the main amplifier to reduce distortion using the same mechanisms as described above.

EXAMPLE 5

Single Ended Oscillator

Figure 9:
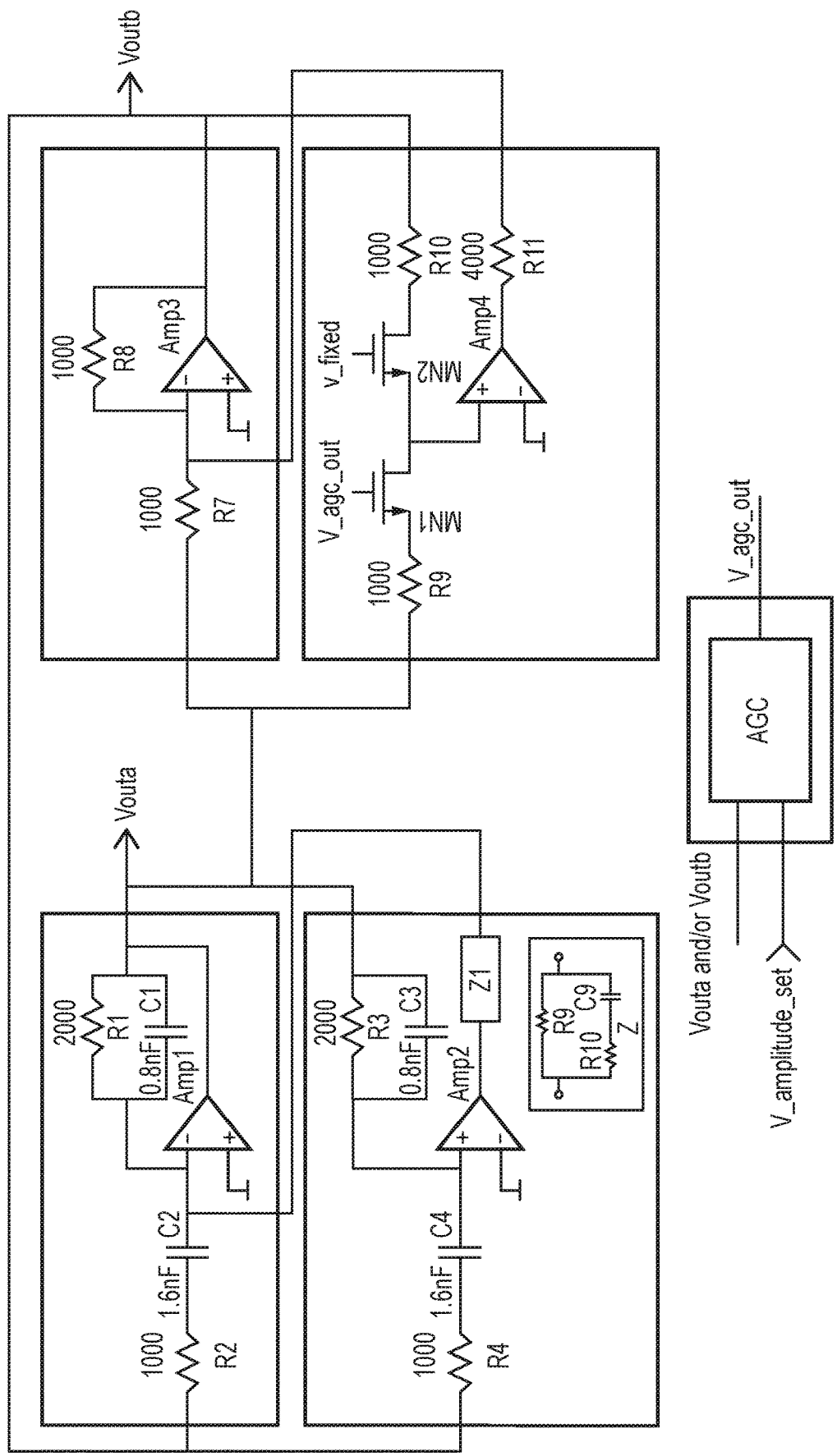
FIG. 9 shows a composite single ended oscillator circuit according to another example of the disclosure.

While in the preceding embodiments, the passive networks have used only resistors, this is not a limitation of the technique. By using frequency dependent elements, such as inductors and capacitors (or distributed inductors and capacitors as in a strip line), the distortion improvement technique can be applied to circuits such as active filters and oscillators. FIG. 9 shows an example single ended oscillator circuit which can also use the "main amplifier" and "compensation amplifier" concept of the present disclosure. The oscillator is formed from two stages with the output of each stage driving the input of the next stage. Each stage includes a main amplifier (Amp1 or Amp3) and an associated resistor (and capacitor) network arranged to provide a gain of −1, with stage 1 providing the gain of −1 only at the oscillator frequency. The oscillator circuit can provide a single ended output from either Vouta or Voutb or a differential output from Vouta and Voutb.

To provide distortion compensation for the oscillator, matching respective compensation management circuits are also provided within each of the two stages. That is, a matching compensation oscillator circuit centered around Amp2 provides distortion compensation signals to Amp1 via network Z1, and likewise a compensation amplifier circuit centered around Amp4 provides distortion compensation signals to Amp3 via R11. As will be seen from the circuit diagram, both the distortion compensation circuits of Amp2 and Amp4 are connected to both the input and output of their respective stages via passive component networks that isolate the distortion in the respective outputs of Amp1 and Amp3 respectively, so that Amp2 and Amp4 are acting on the distortion only. This is achieved, in this example circuit, by choosing identical components for the passive components around each of the main amplifiers and their corresponding compensation amplifiers. The operation of the oscillator circuit, whilst more involved than the amplifiers described previously, is essentially using the same distortion compensation mechanism described previously.

It should be noted that stage2 also includes FETs MN1 and MN2 with MN1 gate voltage being set by the output of an Automatic Gain Control circuit (AGC) and the gate of MN2 being set to a fixed voltage. The combination of an AGC circuit and a gain control element such as a FET to control the amplitude of the oscillator output is well known to those skilled in the art. With the distortion of the two stages being significantly reduced by the technique previously described, it is very easy for the distortion of the oscillator to be then limited by the non-linearity introduced by the gain control FET MN1. The introduction of a matching FET MN2 in the feedback branch of Amp4 allows this distortion to be cancelled. This can be done most effectively if the gates of MN1 and MN2 are at an identical voltage.

With ideal components this will be naturally the case, however it may be necessary to add a trimmable resistor, for example in series with R9, to allow V_agc_out to be trimmed to the same voltage as V_fixed. Alternatively, an active circuit could be configured to adjust the voltage automatically.

EXAMPLE 7

Differential Band-Pass Filter

Figure 10:
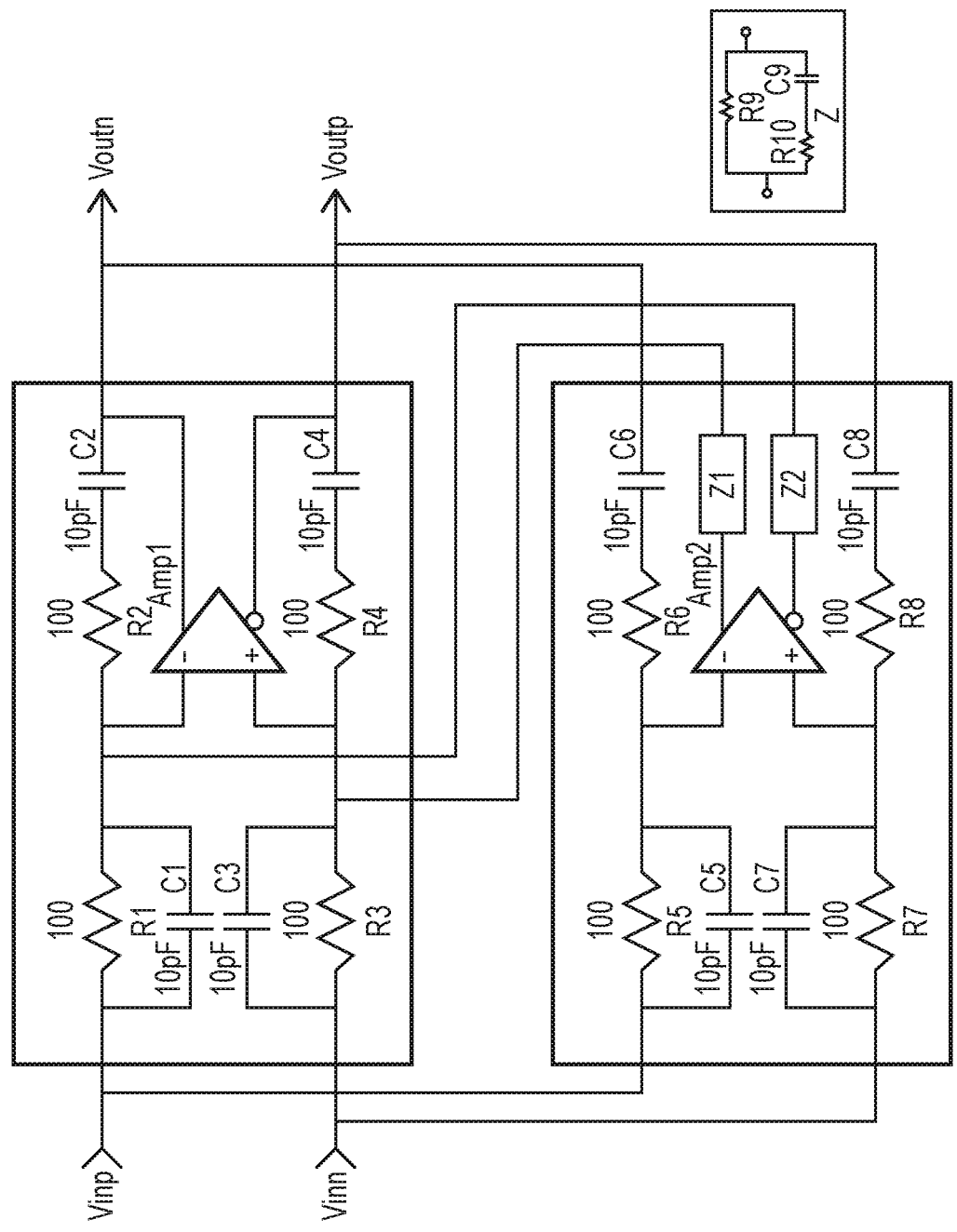
FIG. 10 shows a composite Differential Band-Pass Filter suit according to another example of the disclosure.

FIG. 10 shows a differential band pass filter circuit using the concepts of the present disclosure. Again, the main band-pass filter circuit is centered around Amp1 in the upper box and operates in a similar manner to the differential amplifier circuit described previously, but the with addition of the frequency reactive components C1 to C4 to provide a frequency dependent response. The compensation amplifier circuit centered around Amp2 is shown in the lower box and matches the arrangement of the worker circuit. Choice of identical value corresponding passive components R1-R8 and C1-C8 for the main and compensation circuits ensures that the distortion signal from the outputs of the main amplifier is isolated, so that the compensation amplifier operates on the distortion signal only, with the resulting Amp2 output distortion compensation signals then being injected into each respective channel input of the main amplifier to reduce distortion using the same mechanisms as described above. Note that while corresponding components in the Main amplifier circuit and the compensation amplifier circuit are identical in this example, this need not be the case. For example if R5-R8 are multiplied by a factor K and the caps C5-C8 are also reduced by a factor K then the distortion signal is still correctly isolated.

EXAMPLE 8

Differential Oscillator

Figure 11:
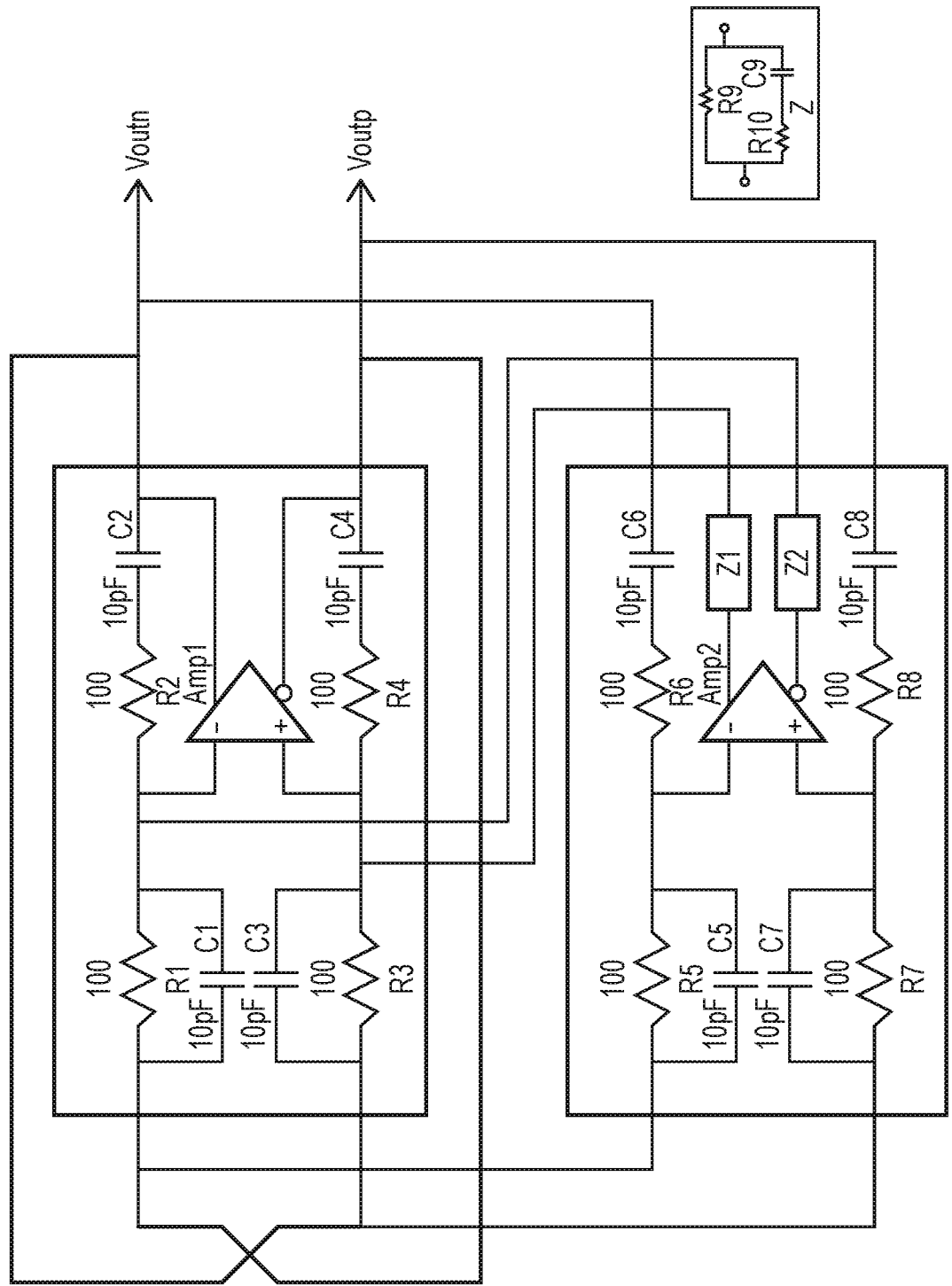
FIG. 11 shows a composite Differential Oscillator circuit according to another example of the disclosure.

FIG. 11 shows a differential oscillator circuit that again displays the same main and compensation architecture described in previous embodiments. The upper box contains the main differential oscillator circuit, whereas the lower box contains the compensation oscillator circuit, of essentially matching configuration, Again R5-R8 and C5-C8 in the compensation amplifier box match corresponding components R1-R4 and C1-C4 in the main amplifier box. So again this arrangement allows the distortion component at the output of the main amplifier to be isolated, so that a distortion compensation signal can be generated by Amp2, and then fed back into input channels of Amp1 via impedance networks Z1 and Z2 (respectively formed by series parallel RC circuit Z).

EXAMPLE 9

Differential Oscillator with Gain Control FETs

Figure 12:
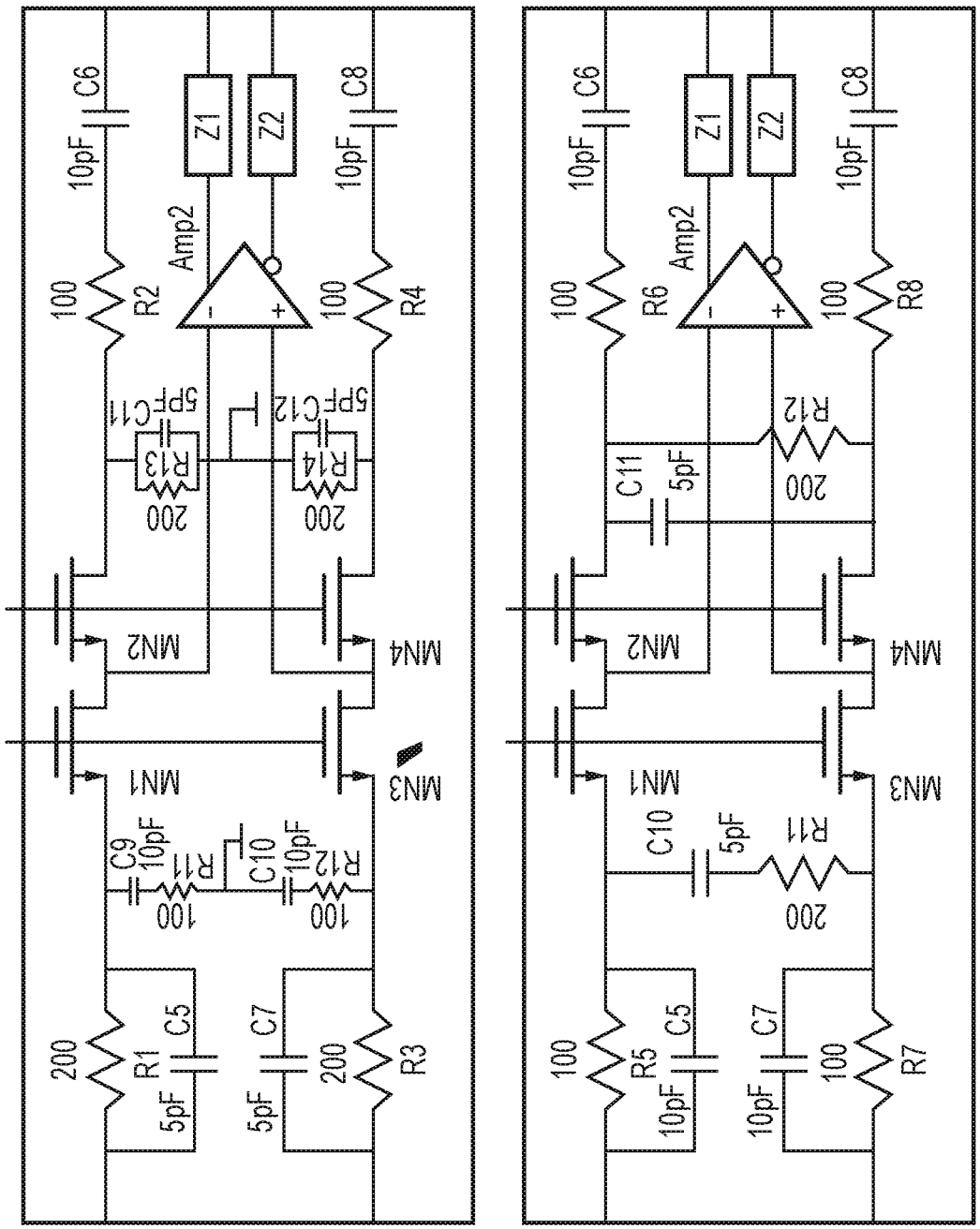
FIG. 12 shows a composite Differential Oscillator circuit with gain control FETs according to another example of the disclosure.

FIG. 12 shows two examples of the manager amplifier of FIG. 11 but including gain control FETs MN1 and MN3. The FETs MN1 and MN3 may for example be controlled by an AGC block and the FETs MN2 and MN4 may be set to a DC voltage. The intention of adding MN2 and MN4 is that the small voltage across these FETS should be identical to the voltage across MN1 and MN3 and any distortion introduced by MN1 and MN3 is cancelled by that introduced by MN2 and MN4. This is the case where gain control FETs are employed in FIG. 9, however this is not necessarily the case here. To explain this, first consider the top example and ignore the smaller sized elements in the figure. The voltage at the source of MN1 is a function of both the non-linear resistance of MN1 over the cycle and the impedances of the parallel combination of R5 and C5. The voltage on the drain of MN2 is a function of the non-linear resistance of MN2 and the impedance of the series combination of R6 and C6. While the impedance to the left and right of these switches match at the frequency of oscillation, at harmonics of this frequency (created by the non-linear resistance of the FETs) these impedances do not match and as a result, the magnitude of the voltages across the FETs will be different. The addition of the smaller sized elements makes the impedances to left-hand side of MN1 and the right-hand side of MN2 now match, as both sides have a series and a parallel combination of identical elements. In the lower example of FIG. 12 the additional components have been simplified while the equivalent impedance remains the same.

With the above, therefore, we present numerous different examples of circuits that can make use of the composite main circuit with distortion reducing compensation circuit of the present disclosure, wherein the compensation circuit acts on the actual distortion signal only introduced by the main circuit, the distortion signal having been isolated from the output of the main circuit via an electrical network of suitable components, which are generally although not necessarily exclusively passive components. By having to act only on the isolated distortion signal, the compensation circuit can operate firmly within its linear region of operation, thus ensuring that little additional distortion is introduced into the compensation signal. The effects of such arrangements are impressive, with simulations showing a reduction in total harmonic distortion measured in tens of dB, and in some cases in excess of 40 dB improvement.

Various modifications, whether by way of addition, subtraction or modification, may be made to the above described examples to provide further examples, any and all of which are intended to be encompassed by the appended claims.

The invention claimed is:

1. A composite amplifier comprising:
a main amplifier circuit, having a main component network and a main amplifier, the amplifier having a first input channel on which a first input signal is input to a first input node of the main amplifier and a first output channel from which a first output signal is output from the main amplifier on a corresponding first output node, the main amplifier circuit responding to the first input signal to produce an output signal including an error component introduced by offsets or nonlinearities in the main amplifier circuit; and
a compensation amplifier circuit connected to the first input channel and first output channel of the main amplifier circuit to receive the first input signal and the first output signal, and having a compensation component network and a compensation amplifier, the arrangement being such that the compensation amplifier circuit combines the first input signal and the first output signal to cancel the first input and first output signals, leaving the error in the first output signal introduced by the main amplifier circuit as an input to the compensation amplifier, the compensation amplifier circuit thereby being arranged to sense the error on the first output channel of the main amplifier circuit, and generate a first error compensation signal in dependence thereon, such that the first error compensation signal is then applied to the main amplifier circuit, wherein the error compensation signal lowers the error in the output signal; and wherein one of:
(1) the first input node of the main amplifier is an inverting input node, the input to the compensation amplifier being applied to a non-inverting input node of the compensation amplifier, and the first error compensation signal is applied to the first input channel of the main amplifier circuit; or
(2) the first input node of the main amplifier is an inverting input node, the input to the compensation amplifier being applied to a non-inverting input node of the compensation amplifier, and the first error compensation signal is applied to the first input channel of the main amplifier circuit.

2. A composite amplifier according to claim 1, wherein the first input node of the main amplifier is an inverting input node, the input to the compensation amplifier being applied to a non-inverting input node of the compensation amplifier, and the first error compensation signal is applied to the first input channel of the main amplifier circuit.

3. A composite amplifier according to claim 1, wherein the first input node of the main amplifier is an inverting input, the input to the compensation amplifier is applied to an inverting input node of the compensation amplifier, and the first error compensation signal is applied back to a second input node of the main amplifier, wherein the second input node of the main amplifier is a non-inverting input.

4. A composite amplifier according to claim 1, wherein the composite amplifier further comprises:
a second main amplifier circuit, having a second main component network and a second main amplifier, the second main amplifier having a second input channel on which a second input signal is input to a first input node of the second main amplifier and a second output channel from which a second output signal is output from the second main amplifier on a corresponding first output node of the second main amplifier, the second main amplifier circuit responding to the second input signal to produce a second output signal including an error component introduced by offsets or nonlinearities in the second main amplifier circuit; and
a second compensation amplifier circuit connected to the second input channel and second output channel of the second main amplifier circuit to receive the second input signal and the second output signal, and having a second compensation component network and a second compensation amplifier, the arrangement being such that the second compensation amplifier circuit combines the second input signal and the second output signal to cancel the second input and second output signals, leaving the error in the second output signal introduced by the second main amplifier circuit as a first input to a first input node of the second compensation amplifier, the second compensation amplifier circuit thereby being further arranged to sense the error on the second output channel of the second main amplifier circuit, and generate a second error compensation signal in dependence thereon, the arrangement being such that the second error compensation signal is then applied to the second main amplifier circuit, wherein the second error compensation signal lowers the error in the second output signal; and connections arranged so as to cause the composite amplifier to operate as an oscillator, the connections comprising the first output channel of the main amplifier circuit being coupled to the second input channel of the second main amplifier circuit, wherein the first output signal is the second input signal, and the second output channel of the second main amplifier circuit being coupled to the first input channel of the main amplifier circuit, wherein the second output signal is the first input signal.

5. A composite amplifier according to claim 4, wherein the main amplifier circuit is configured such that the main amplifier circuit provides a gain of −1 at a chosen frequency of oscillation.

6. A composite amplifier according to claim 1, wherein the main component network further comprises reactive components.

7. A composite amplifier according to claim 4, wherein the compensation component network includes identical components to those in the main component network, and the second compensation component network includes identical components to those in the second main component network.

8. A composite amplifier according to claim 4, wherein the second compensation component network comprises:
   a gain control transistor, wherein the gain control transistor introduces a non-linear voltage error; and
   a second transistor, arranged so as to compensate for the non-linear voltage error introduced by the gain control transistor.

9. A composite amplifier according to claim 8, wherein:
   the gain control transistor is coupled between the second input channel and the first node of the second compensation amplifier; and
   the second transistor is coupled between the second output channel and the first node of the second compensation amplifier.

10. A composite amplifier according to claim 8, wherein the gain control transistor is controlled by an Automatic Gain Control circuit.

11. A composite amplifier according to claim 8 wherein a control terminal of the gain control transistor and a control terminal of the second transistor are set to a substantially similar voltage such that a voltage dropped across the gain control transistor is substantially similar to a voltage dropped across the second transistor, thereby causing cancellation of the non-linear voltage error.

12. A composite amplifier according to claim 1, wherein the composite amplifier is a differential amplifier, further having a second input channel on which a second input signal is input to a second input node of the main amplifier and a second output channel from which a second output signal is output from the main amplifier on a corresponding second output node, the main amplifier circuit responding to the second input signal to produce a second output signal including an error component introduced by offsets or nonlinearities in the main amplifier circuit; and the compensation amplifier circuit being further connected to the second input channel and the second output channel of the main amplifier circuit to receive the second input signal and the second output signal, and having a compensation component network and a compensation amplifier, the arrangement being such that the compensation amplifier circuit combines the second input signal and the second output signal to cancel the second input and second output signals, leaving the error in the second output signal introduced by the main amplifier circuit as an input to a second input of the compensation amplifier, the compensation amplifier circuit thereby being arranged to sense the error on the second output channel of the main amplifier circuit in addition to the first output channel, and generate a second error compensation signal in dependence on the error on the second output channel, the arrangement being such that the second error compensation signal is then applied to the second input channel of the main amplifier circuit and the first error compensation signal is then injected back onto the first input channel of the main amplifier circuit, wherein the error compensation signals lower the error in the respective first and second output signals.

13. A composite amplifier according to claim 12, wherein the compensation component network further comprises respective reactive component networks.

14. A composite amplifier according to claim 12, wherein the differential amplifier comprises connections to cause the composite amplifier to operate as a differential oscillator.

15. A composite amplifier according to claim 14, wherein the connections comprise the first output channel being coupled to the second input channel of the main amplifier wherein the first output signal is fed back as the second input signal, and the second output channel being coupled to the first input channel of the main amplifier wherein the second output signal is fed back as the first input signal.

16. A composite amplifier according to claim 14, wherein the compensation component network further comprises:
   a first gain control transistor,
   wherein the first gain control transistor introduces a first non-linear voltage error;
   a second gain control transistor,
   wherein the second gain control transistor introduces a second non-linear voltage error;
   a third transistor, arranged so as to compensate for the non-linear voltage error introduced by the first gain control transistor; and
   a fourth transistor, arranged so as to compensate for the non-linear voltage error introduced by the second gain control transistor.

17. A composite amplifier according to claim 16, wherein:
   the first gain control transistor is coupled between the first input channel and the compensation amplifier;
   the second gain control transistor is coupled between the second input channel and the compensation amplifier;
   the third transistor is coupled between the first output channel and the compensation amplifier; and
   the fourth transistor is coupled between the second output channel and the compensation amplifier.

18. A composite amplifier according to claim 17, wherein the compensation component circuit further comprises:
   a first additional impedance network, arranged such that, at a frequency of oscillation of the oscillator, an impedance coupled between the first input channel and the first gain control transistor is the same as an impedance coupled between the first output channel and the third transistor; and
   a second additional impedance network, arranged such that, at the chosen frequency of oscillation, an impedance coupled between the second input channel and the second gain control transistor is the same as an impedance coupled between the second output channel and the fourth transistor.

19. A composite amplifier comprising:
a main amplifier circuit, having a main component network and a main amplifier, wherein the main amplifier comprises:
a first input channel on which a first input signal is input to a non-inverting input node of the main amplifier;
an inverting input node;
a first output channel from which a first output signal is output from the main amplifier on a corresponding first output node, the main amplifier introducing an error component, introduced by offsets or nonlinearities in the main amplifier circuit, into the first output signal;
a compensation amplifier circuit, connected to the first input channel and the first output channel, having a compensation component network and a compensation amplifier, wherein the compensation amplifier comprises:
a non-inverting input node, wherein the non-inverting input node is connected to the first output channel via the compensation component network;
an inverting input node, wherein the inverting input node is connected to the first input channel;
wherein the compensation amplifier circuit is arranged to sense the error of the first output channel of the main amplifier circuit, and generate a first error compensation signal in dependence thereon, the arrangement being such that the first error compensation signal is applied to the inverting input node of the main amplifier; and
wherein the error compensation signal lowers the error in the output signal.

20. A composite amplifier comprising:
a main amplifier circuit, having a main component network and a main amplifier, the amplifier having a first input channel on which a first input signal is input to a first input node of the main amplifier and a first output channel from which a first output signal is output from the main amplifier on a corresponding first output node, the main amplifier circuit responding to the first input signal to produce an output signal including an error component introduced by offsets or nonlinearities in the main amplifier circuit;
a compensation amplifier circuit connected to the first input channel and first output channel of the main amplifier circuit to receive the first input signal and the first output signal, and having a compensation component network and a compensation amplifier, the arrangement being such that the compensation amplifier circuit combines the first input signal and the first output signal to cancel the first input and first output signals, leaving the error in the first output signal introduced by the main amplifier circuit as an input to the compensation amplifier, the compensation amplifier circuit thereby being arranged to sense the error on the first output channel of the main amplifier circuit, and generate a first error compensation signal in dependence thereon, such that the first error compensation signal is then applied to the main amplifier circuit, wherein the error compensation signal lowers the error in the output signal;
a second main amplifier circuit, having a second main component network and a second main amplifier, the second main amplifier having a second input channel on which a second input signal is input to a first input node of the second main amplifier and a second output channel from which a second output signal is output from the second main amplifier on a corresponding first output node of the second main amplifier, the second main amplifier circuit responding to the second input signal to produce a second output signal including an error component introduced by offsets or nonlinearities in the second main amplifier circuit;
a second compensation amplifier circuit connected to the second input channel and second output channel of the second main amplifier circuit to receive the second input signal and the second output signal, and having a second compensation component network and a second compensation amplifier, the arrangement being such that the second compensation amplifier circuit combines the second input signal and the second output signal to cancel the second input and second output signals, leaving the error in the second output signal introduced by the second main amplifier circuit as a first input to a first input node of the second compensation amplifier, the second compensation amplifier circuit thereby being further arranged to sense the error on the second output channel of the second main amplifier circuit, and generate a second error compensation signal in dependence thereon, the arrangement being such that the second error compensation signal is then applied to the second main amplifier circuit, wherein the second error compensation signal lowers the error in the second output signal; and
connections arranged so as to cause the composite amplifier to operate as an oscillator, the connections comprising the first output channel of the main amplifier circuit being coupled to the second input channel of the second main amplifier circuit, wherein the first output signal is the second input signal, and the second output channel of the second main amplifier circuit being coupled to the first input channel of the main amplifier circuit, wherein the second output signal is the first input signal.

21. A composite amplifier comprising:
a main amplifier circuit, having a main component network and a main amplifier, the amplifier having a first input channel on which a first input signal is input to a first input node of the main amplifier and a first output channel from which a first output signal is output from the main amplifier on a corresponding first output node, the main amplifier circuit responding to the first input signal to produce an output signal including an error component introduced by offsets or nonlinearities in the main amplifier circuit;
a compensation amplifier circuit connected to the first input channel and first output channel of the main amplifier circuit to receive the first input signal and the first output signal, and having a compensation component network and a compensation amplifier, the arrangement being such that the compensation amplifier circuit combines the first input signal and the first output signal to cancel the first input and first output signals, leaving the error in the first output signal introduced by the main amplifier circuit as an input to the compensation amplifier, the compensation amplifier circuit thereby being arranged to sense the error on the first output channel of the main amplifier circuit, and generate a first error compensation signal in dependence thereon, such that the first error compensation signal is then applied to the main amplifier circuit, wherein the error compensation signal lowers the error in the output signal;

wherein the composite amplifier is a differential amplifier, further having a second input channel on which a second input signal is input to a second input node of the main amplifier and a second output channel from which a second output signal is output from the main amplifier on a corresponding second output node, the main amplifier circuit responding to the second input signal to produce a second output signal including an error component introduced by offsets or nonlinearities in the main amplifier circuit; and the compensation amplifier circuit being further connected to the second input channel and the second output channel of the main amplifier circuit to receive the second input signal and the second output signal, and having a compensation component network and a compensation amplifier, the arrangement being such that the compensation amplifier circuit combines the second input signal and the second output signal to cancel the second input and second output signals, leaving the error in the second output signal introduced by the main amplifier circuit as an input to a second input of the compensation amplifier, the compensation amplifier circuit thereby being arranged to sense the error on the second output channel of the main amplifier circuit in addition to the first output channel, and generate a second error compensation signal in dependence on the error on the second output channel, the arrangement being such that the second error compensation signal is then applied to the second input channel of the main amplifier circuit and the first error compensation signal is then injected back onto the first input channel of the main amplifier circuit, wherein the error compensation signals lower the error in the respective first and second output signals.

* * * * *